United States Patent [19]

Hoshino

[11] Patent Number: 5,463,584
[45] Date of Patent: Oct. 31, 1995

[54] SEMICONDUCTOR MEMORY DEVICE

[75] Inventor: Yasuharu Hoshino, Tokyo, Japan

[73] Assignee: NEC Corporation, Tokyo, Japan

[21] Appl. No.: 243,009

[22] Filed: May 16, 1994

Related U.S. Application Data

[63] Continuation of Ser. No. 693,119, Apr. 29, 1991, abandoned.

[30] Foreign Application Priority Data

Apr. 27, 1990 [JP] Japan ................................. 2-112414
Apr. 28, 1990 [JP] Japan ................................. 2-112266

[51] Int. Cl.$^6$ ............................. G11C 7/00; G11C 8/00
[52] U.S. Cl. ........................... 365/189.05; 365/230.08; 365/203
[58] Field of Search ................... 365/189.05, 189.12, 365/221, 230.04, 230.08, 239, 240, 203

[56] References Cited

U.S. PATENT DOCUMENTS

| | | | |
|---|---|---|---|
| 4,577,293 | 3/1986 | Matick et al. | 365/189 |
| 4,603,403 | 7/1986 | Toda | 365/189.05 |
| 4,658,377 | 4/1987 | McElroy | 365/230.08 X |
| 4,855,957 | 8/1989 | Nogami | 365/189.05 X |
| 4,954,987 | 9/1990 | Auvinen et al. | 365/230.08 X |
| 4,974,203 | 11/1990 | Sukurai | 365/189.05 X |
| 5,029,134 | 7/1991 | Watanabe | 365/189.12 X |

FOREIGN PATENT DOCUMENTS

| | | |
|---|---|---|
| 0170285 | 2/1986 | European Pat. Off. . |
| 0249548 | 12/1987 | European Pat. Off. . |

Primary Examiner—Benny Lee
Attorney, Agent, or Firm—Sughrue, Mion, Zinn, Macpeak & Seas

[57] ABSTRACT

The semiconductor memory device according to the present invention includes a plurality of memory cells that are provided in array form and a plurality of bit lines and word lines that are respectively connected to these memory cells, and comprises a memory cell array arranged so as to form pairs of bit lines, a data register circuit consisting of a plurality of registers, and selection means for respectively connecting predetermined bit line pairs out of the plurality of bit line pairs to a plurality of registers in response to a control signal.

This data register circuit is formed by arranging the plurality of registers in a single line.

With such a constitution, the number of registers that constitute the data register circuit can be reduced compared with the conventional device. Accordingly, it becomes possible to arrange the registers in a single line, the area for the data register circuit can sharply be reduced in comparison to the case of the conventional device, contributing to the integration of the semiconductor memory device.

4 Claims, 11 Drawing Sheets

SEMICONDUCTOR MEMORY DEVICE

This is a Continuation of application Ser. No. 07/693,119 filed Apr. 29, 1991 now abandoned.

BACKGROUND OF THE INVENTION

1. Field of the Invention

The present invention relates to a semiconductor memory device, and more particularly to a semiconductor memory device for video data.

2. Description of the Prior Art

In recent years, semiconductor memory devices are being used widely for office automation devices such as personal computers. Of these semiconductor memory devices, MOS random access memories (RAMs) can be used as video memories for displaying images on a display device of a personal computer and the like.

Namely, a construction is employed in which a memory device is installed between the CPU within the personal computer and the display device, and the image data of the picture is accessed on a random basis by the CPU. As such a semiconductor memory device for an image, there is being proposed a type which has two kinds of input/output ports. That is, it is a semiconductor memory device which has two ports; one random port for rewriting data within a memory cell array by means of an access from the CPU, and one serial port for supplying image signals to the display device without interruption. Such a semiconductor memory device is generally called a dual port memory.

The dual port memory is constructed by including a data register circuit which stores data supplied by the memory cell array, and serially reads data to the serial port. The conventional data register circuit is constructed by arranging a plurality of registers that are provided in one to one correspondence with each bit line pair of the memory cell array.

However, such a register has a circuit structure which is more complex and requires a larger number of elements than the memory cell. Moreover, because of the high speed operation that is required it is constructed by using transistors with a large driving capability, that is, transistors with a large size. As a result, the formation area for the registers becomes considerably larger than that of the memory cells. When a plurality of the registers are arranged corresponding to the bit line pairs of the memory cell array, it is not possible to array them in one line but rather they have to be arranged in two or more lines because the width of the register is larger than the spacing between the bit line pair.

Accordingly, the area for the data register circuit becomes very large, which obstructs the integration of the semiconductor memory device as a whole.

BRIEF SUMMARY OF THE INVENTION

Object of the Invention

It is therefore the object of the present invention to provide a semiconductor memory device which can prevent the increase in the formation area of the data register circuit, and can thus contribute to the integration of the semiconductor memory device as a whole.

SUMMARY OF THE INVENTION

The semiconductor memory device according to the present invention comprises a memory cell array which includes a plurality of memory cells arranged in array form and a plurality of bit lines and word lines connected to each of the memory cells. The bit lines are arranged so as to form a set of pairs. A data register circuit consists of a smaller number of registers than the number of the bit line pairs, and a selective means subdivides the bit line pairs into a plurality of sets each consisting of an equal-number of bit line pairs, and selects one bit line pair from the respective sets and connects them to the respective registers.

The data register circuit is constructed by arranging a plurality of registers in one line.

Further, the present invention can also be applied to a data register circuit formed by a register that includes a latch circuit that stores data, means for activating the latch circuit in response to at least one activation signal, a data wiring, and means for connecting the data wiring to the latch circuit in response to at least one of the activation signals.

BRIEF DESCRIPTION OF THE DRAWINGS

The above-mentioned and other objects, features and advantages of this invention will become more apparent by reference to the following detailed description of the invention taken in conjunction with the accompanying drawings in which like reference numerals are associated with similar elements throughout; and wherein.

DETAILED DESCRIPTION OF THE INVENTION

Figure 1:
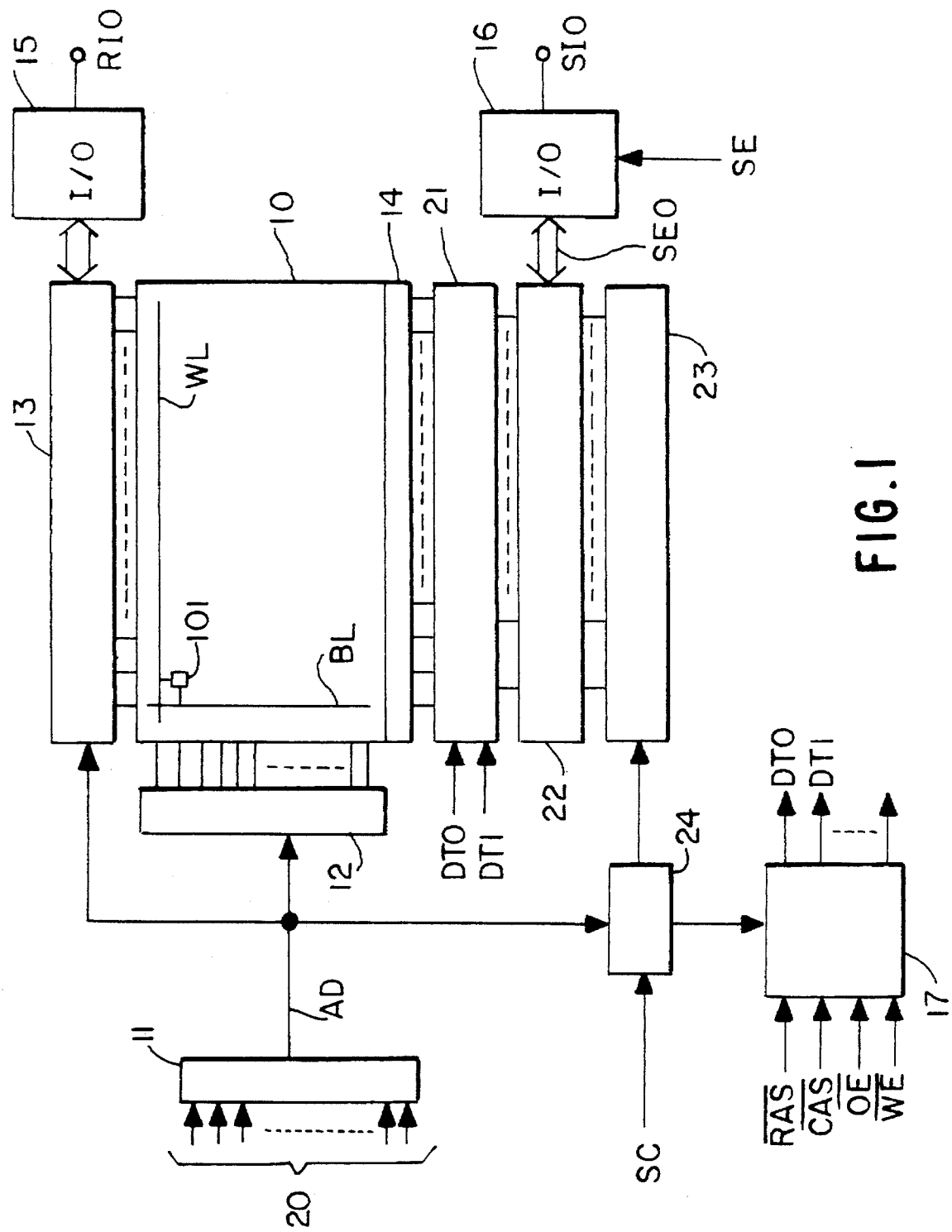
FIG. 1 is a block diagram showing the overall construction of the semiconductor memory device in a first embodiment according to the present invention.

First, referring to FIG. 1, the overall construction of the semiconductor memory device according to the first embodiment of the present invention will be described. Here, the embodiment will be described, with a dynamic random access memory (DRAM) formed by arranging the so-called one transistor-one capacitor type cell 101 where memory cell array 10 is constructed by one N-channel type MOS transistor and one capacitor element, as an example.

Row decoder 12 and column decoder 13 select one line out of a plurality of word lines and one pair out of a plurality of bit line pairs, respectively, in response to address signals supplied by address buffer 11. These address signals are supplied in time division mode to the address buffer 11 from address lines 20. Clock generator 17 is a circuit which inputs externally supplied $\overline{RAS}$ signal, $\overline{CAS}$ signal, $\overline{OE}$ signal and $\overline{WE}$ signal, and generates control signals DT0, DT1 and the like in response to these input signals. Sense amplifier circuit 14 includes sense amplifiers that are equal in number to the number of the bit line pairs, with each sense amplifier being connected to a pair of bit lines BL. The sense amplifier circuit 14 amplifies the potentials of bit lines BL corresponding to the data of all the memory cells governed by one line of word lines WL selected in response to the input address signals.

The present semiconductor memory device is the so-called dual port memory which has random I/O buffer 15 and serial I/O buffer 16. The random I/O buffer 15 is connected to column decoder 13, and carries out read and write for the memory cell array 10 at the time of random access.

On the other hand, the serial I/O buffer 16 is connected to data register circuit 22, and carries out read and write of data for the register selected by selector 23 at the time of input and output of serial data. Selection gate circuit 21 is provided according to the present invention between the sense amplifier circuit 14 and the data register circuit 22. The selection gate circuit 21 selects a predetermined bit line pair in response to the control signals DT0 and DT1, and causes the selected bit line pair to be connected to the data register circuit 22. Address counter 24 receives an initial value (tap address) as an input, increases this value in response to an SC signal, and supplies the result to the selector 23.

With the construction as described in the above, it is possible to execute data read and write by means of the random I/O buffer 15 and the serial I/O buffer 16.

With the above in mind, referring to FIG. 2 and FIG. 3, the data read and write operations at the time of random access will be described.

Figure 2:
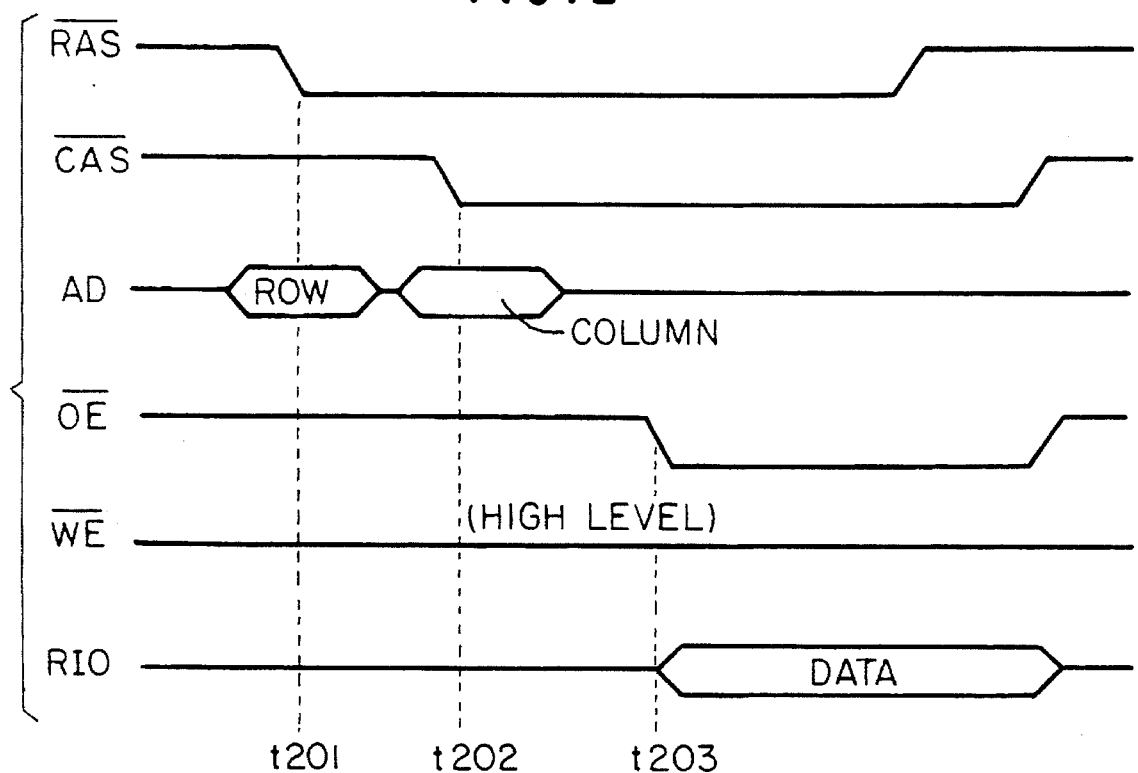
FIG. 2 is a timing chart for explaining the read operation by random access of the semiconductor memory device shown in FIG. 1.

FIG. 2 shows a timing chart for the read operation of the embodiment illustrated in FIG. 1. First, when a low active row address strobe $\overline{RAS}$ signal is input (at t201), a row address is supplied externally to the address buffer 11. Then, the row address signal is given from the address buffer 11 to the row decoder 12, and the logic of one word line selected by the row address signal is brought to a high level. Next, the sense amplifier circuit 14 is activated, and the sense amplifier circuit 14 senses and amplifies a signal at the bit line BL to a high level or a low level in response to information 0 or 1 stored in the memory cell that is connected in the selected word line. At this time, the other bit line of the bit line pair is amplified by the same amplifier in the relation complementary to the level of the selected bit line, in other words, amplified to the opposite voltage level.

Next, a low active column strobe $\overline{CAS}$ signal is input (at t202), a column address is supplied to the address buffer 11 which is sent to the column decoder 13. Next, the column decoder 13 selects a bit line pair in response to the column address. Information in the selected cell corresponds to the high or low level state of the selected bit line pair. The level of the bit line pair is output from input/output terminal RIO (See FIG. 1) at the time of the fall (t203) of the $\overline{OE}$ signal.

Figure 3:
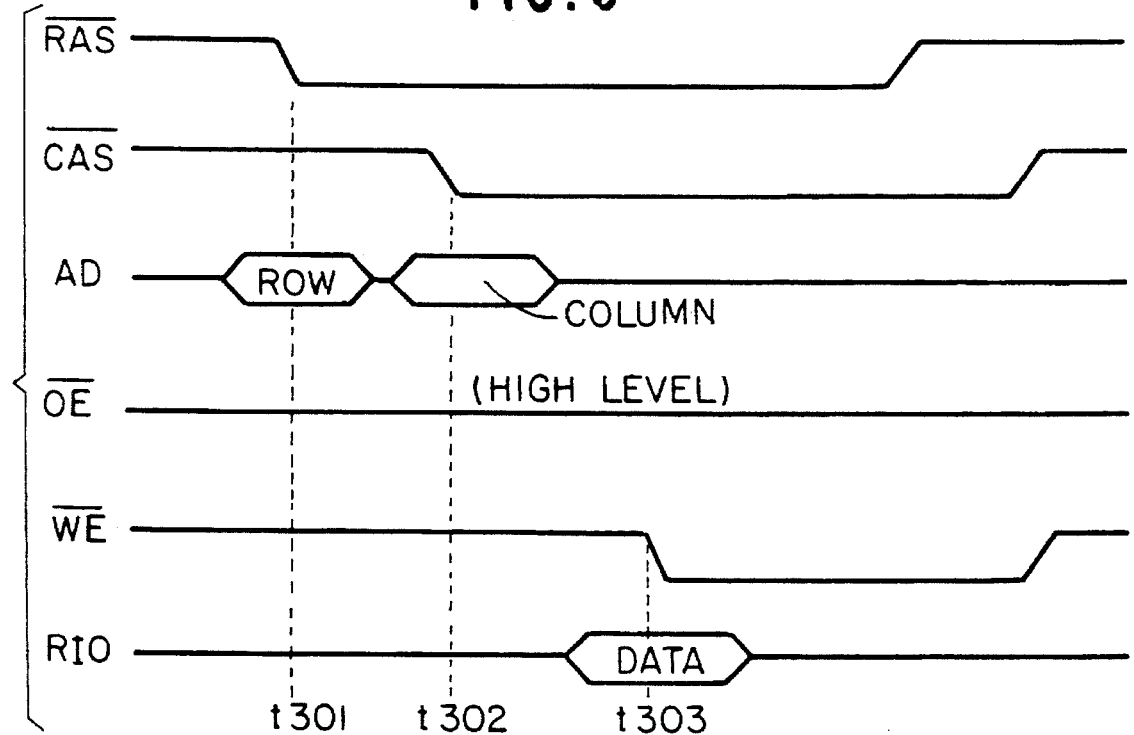
FIG. 3 is a timing chart for explaining the write operation by random access of the semiconductor memory device shown in FIG. 1.

On the other hand, the data write operation of the embodiment illustrated in FIG. 1 is carried out as shown in FIG. 3. Namely, a word line and a bit line pair are selected (at t301 and t302) by an input address similar to the case of the read operation, supplies a write data input from RIO via the random I/O buffer 15 to the selected bit line pair at the time of the fall (t303) of the $\overline{WE}$ signal, and the data is amplified by the sense amplifier 14 connected to the selected bit line pair to be written to the memory cell.

The random access operation described above is similar to the case of the conventional dual port memory. In addition, at the time of the random access operation, the selected gate circuit 21 is set to be in the nonconducting state, in other words, the control signals DT0 and DT1 are set at the inactive level in order to avoid the connection between the memory cell array 10 and the data register circuit 22. Accordingly, it is possible to carry out the serial data input/output operation of the data register circuit 22 asynchronously with the random access operation.

Next, referring to FIG. 4 to FIG. 7, the construction of the selected gate circuit 21 and the data register circuit 22, which are the features of the present invention, as well as the data transfer operation between the memory cell array 10 and the data register circuit 22 and the serial data input/output operation of the data register circuit 22 will be described in more detail.

Figure 4:
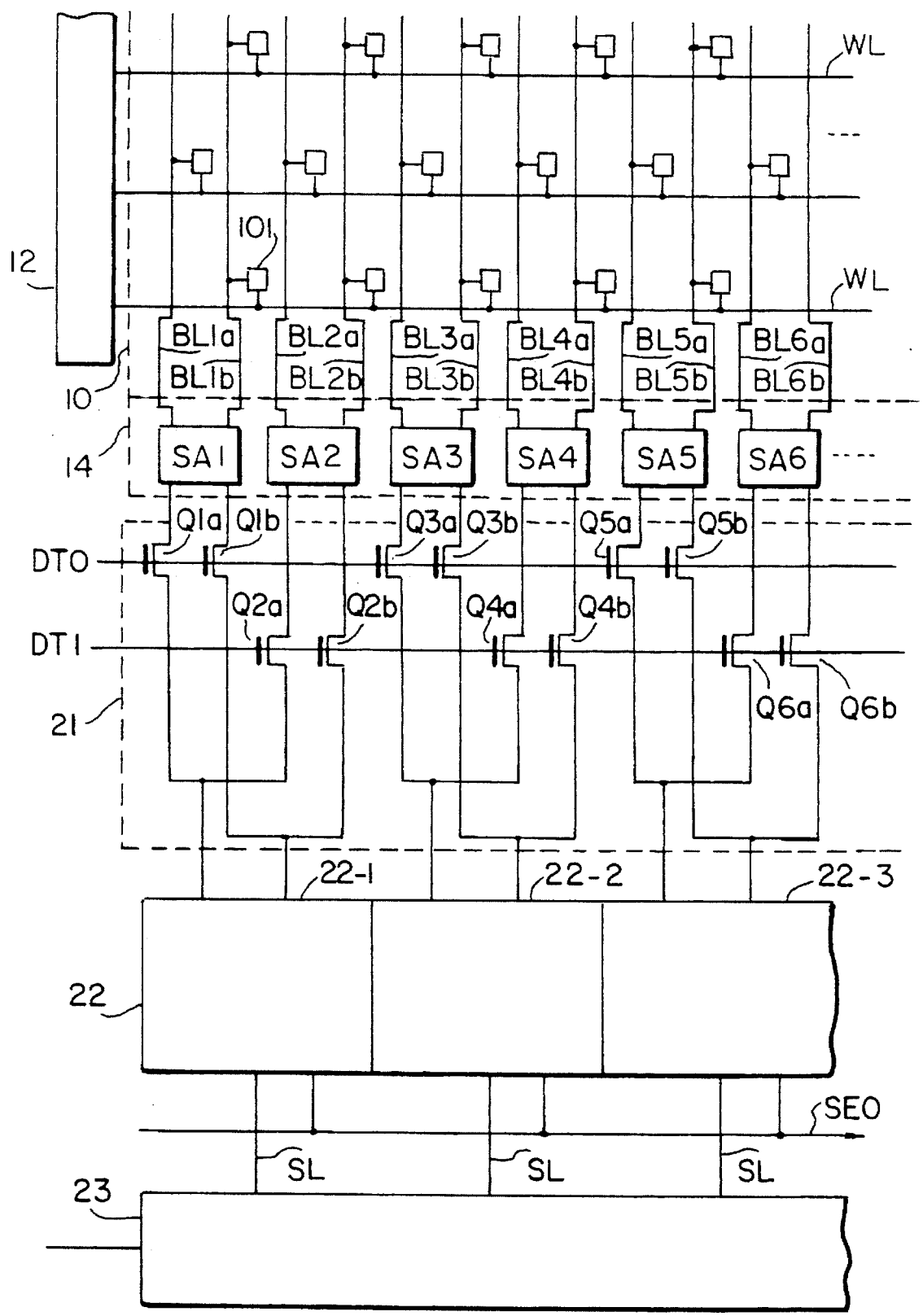
FIG. 4 is a circuit diagram showing the partial circuit construction of the semiconductor memory device shown in FIG. 1.

FIG. 4 is a circuit diagram which partially shows the memory cell array 10, the sense amplifier circuit 14, the selection gate circuit 21, the data register circuit 22 and the selector 23 of FIG. 1. The word lines WL and the bit lines BL1a, BL1b, BL2a, BL2b, BL3a, BL3b, BL4a, BL4b, BL5a, BL5b, BL6a, BL6b, and the like, are respectively connected to predetermined memory cells 101. The sense amplifiers SA1, SA2, SA3, SA4, SA5, SA6, and the like, are connected to pairs of bit lines BL1a and BL1b, BL2a and BL2b, BL3a, BL3b, BL4a, BL4b, BL5a, BL5b, BL6a, BL6b, and the like, respectively. The selected gate circuit 21 is a circuit for connecting one sense amplifier of each set of sense amplifiers that consists of an equal number of sense amplifiers, to each register within the data register circuit 22, in response to the control signals DT0 and DT1, and is constructed by including a plurality of gate transistors Q1a, Q1b, Q2a, Q2b, Q3a, Q3b, Q4a, Q4b, Q5a, Q5b, and the like, which receive the control signals to their gates and have the source and the drain routes provided between the sense amplifier circuit 14 and the data register circuit 22.

The present embodiment is of a construction in which two sense amplifiers form one set, one sense amplifier is selected by the selected gate circuit 21 from each set, and these selected amplifiers are connected to the various registers 22-1, 22-3) and the like. Namely, in order to control the continuity between the one half of the sense amplifiers SA1, SA3, SA5, and the like, out of the totality of the sense amplifiers and the registers 22-1, 22-2, 22-3, and the like, there are provided a plurality of gate transistors Q1a and Q1b, Q3a and Q3b, Q5a and Q5b, and the like, to whose gates is supplied the control signal DT0. On the other hand, in order to control the continuity between the remaining one half of the sense amplifiers SA2, SA4, SA6, and the like, and the registers 22-1, 22-2, 22-3, and the like, there are provided a plurality of gate transistors Q2a and Q2b, Q4a and Q4b, Q6a and Q6b, and the like, to whose gates is supplied the control signal DT1.

The selector 23 carries out the data input/output operation by generating a selection signal SL upon receipt of a signal from the address counter 24 (FIG. 1), and connecting a predetermined register of the data register circuit 22 to the serial I/O buffer 16 (FIG. 1).

With a construction as in the above, two sense amplifiers share one register, and the number of registers that constitute the data register circuit 22 can be reduced to one half of the conventional value. Accordingly, it becomes possible to arrange the registers in one line, so that the area for the data register circuit 22 can sharply be reduced compared with the conventional device, thereby contributing to the integration of the semiconductor memory as a whole.

Figure 5:
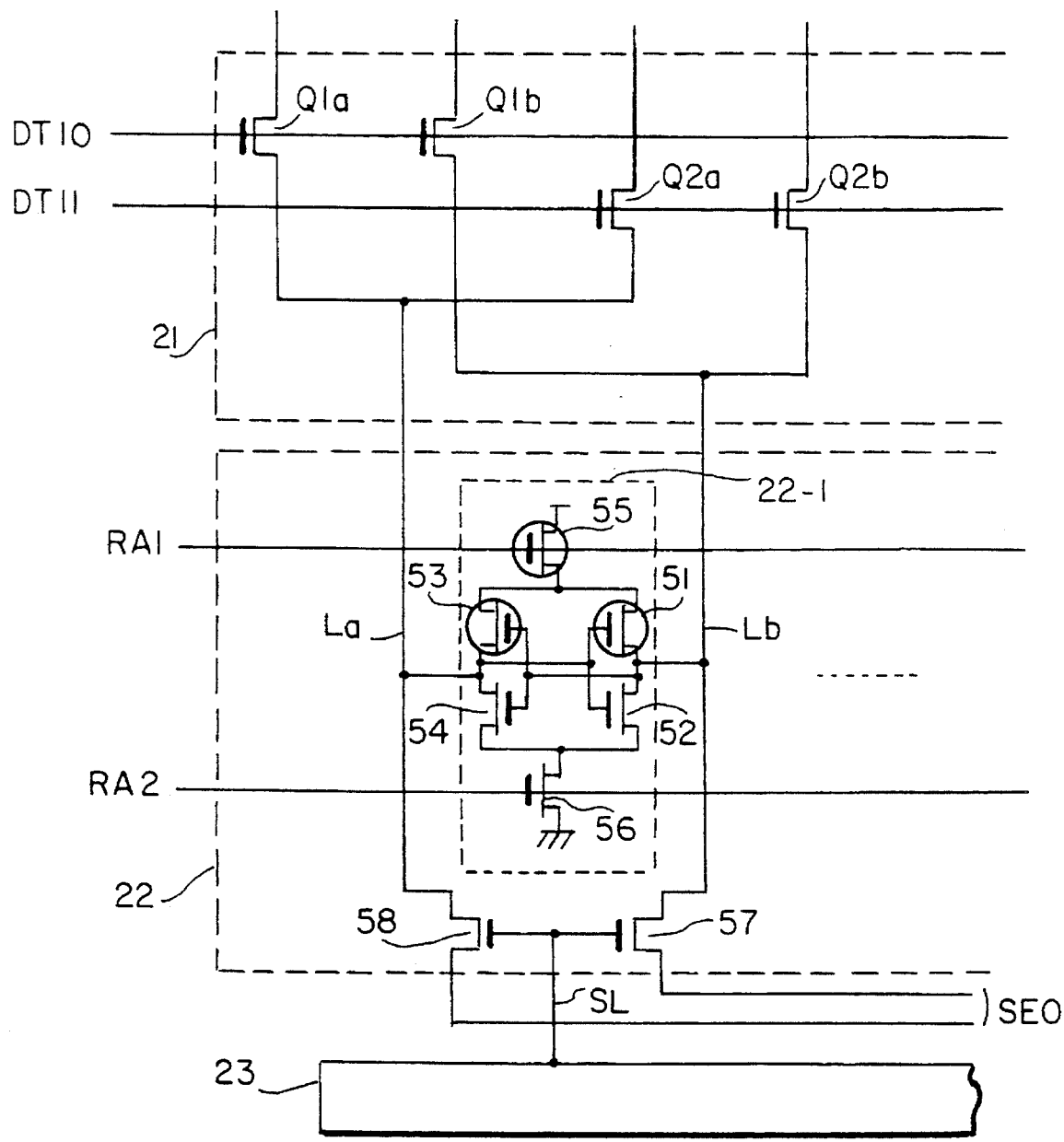
FIG. 5 is a circuit diagram showing a further detailed partial circuit construction of the semiconductor memory device as shown in FIG. 1.

In FIG. 5 is shown an example of circuit construction of the register 22-1 that constitutes the data register circuit 22. The register 22-1 is constituted of wirings La and Lb that are in mutually complementary relation and are connected by the selected gate circuit 21 to the output line pair of either of the sense amplifiers SA1 and SA2 (FIG. 4), a CMOS inverter consisting of a P-channel transistor 51 and an N-channel transistor 52 that have the wiring La as their inputs, and a CMOS inverter consisting of a P-channel transistor 53 and an N-channel transistor 54 that have the wiring Lb as their inputs, and includes a latch circuit formed by connecting the output of each of the inverters to the input of the other inverter, and a P-channel transistor 55 and N-channel transistor 56 which supply power voltages to the latch circuit, and the continuity between them is controlled by the signals RA1 and RA2 that are in the mutually complementary relation. Other registers 22-2 (see FIG. 4) and the like have similar constructions.

The register 22-1 with such a construction normally has the signals RA1 and RA2 at active levels (namely, RA1 at a low level, and RA2 at a high level) which are supplied to capacitors that include the wiring capacitance between the wirings La and Lb, and complementarily stores the data 0 or 1. When the selection signal SL from the selector 23 goes to the active level, gate transistors 57 and 58 that constitute transfer gates are energized, and the stored data are supplied to the serial I/O buffer 16 (FIG. 1) via the serial I/O buffer 16.

Next, referring to FIG. 6 and FIG. 7, the data transfer operation between the memory cell array 10 and the data register circuit 22 shown in FIG. 4 and FIG. 5, and the serial data input/output operation of the data register circuit 22 will be described.

Figure 6A:
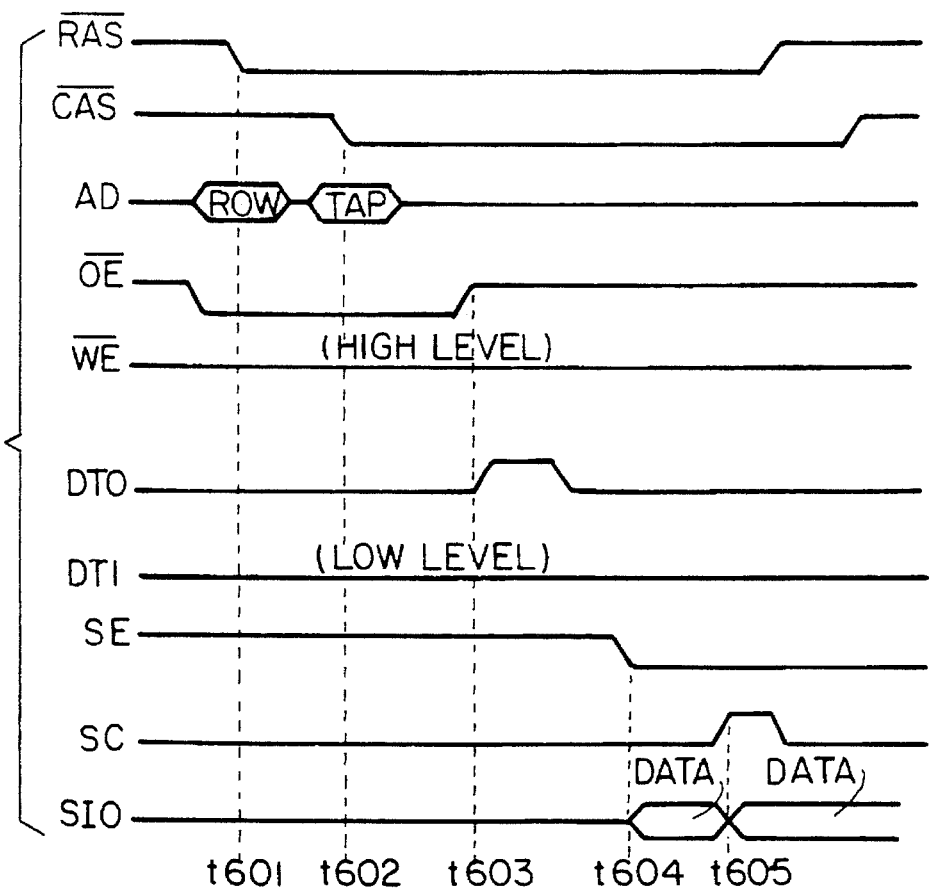
FIGS. 6(a) and 6(b) are timing charts for explaining the serial data read operation in the semiconductor memory device including the circuit shown in FIG. 4 or FIG. 5.
Figure 6B:
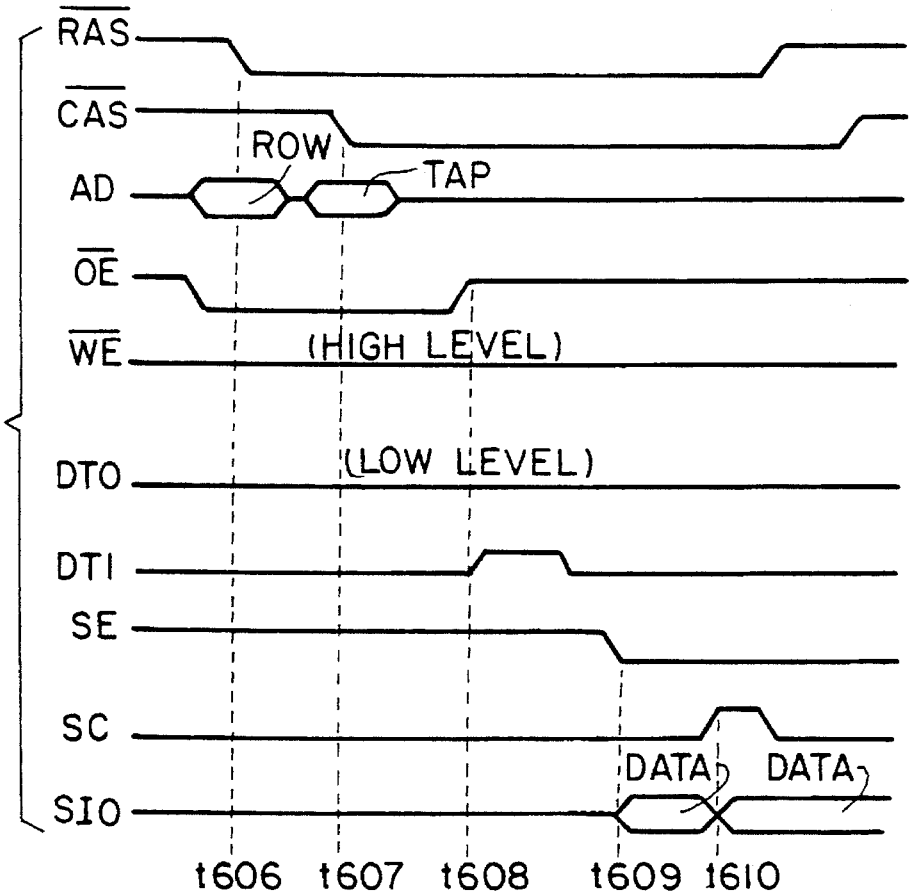

FIGS. 6(a) and 6(b) show timing charts for data transfer from the memory cell array 10 to the data register circuit 22, then a serial data is output from the data register circuit 22 to input/output terminal SIO via the serial I/O buffer 16.

First, when a data is to be transferred from the memory cell array 10 to the data register circuit 22, the address buffer 11 (FIG. 1) fetches a row address at the fall (t601) of the RAS signal and sends it to the row decoder 12 (FIG. 1), and fetches at the fall (t602) of the CAS signal the head element address for write to the data register circuit 22 and the tap address that includes selection information (namely, information for shifting the control signal DT0 to the active level) for the selected gate circuit 21, and send them to the address counter 24. The row decoder 12 selects one word line WL based on the row address, and the data in the memory cells governed by the word line are supplied respectively to the bit lines that are connected to the memory cells. The sense amplifier circuit 14 amplifies the data as complementary data.

Afterward, the $\overline{OE}$ signal rises (at t603) and when the $\overline{WE}$ signal is at the high level, the control signal DT0 that is generated by clock generator 17 is made to rise by the selection information for the selected gate circuit 21 of the tap address supplied by the address counter 24, and the gate transistors Q1a and Q1b, Q3a and Q3b, Q5a and Q5b, and the like (see FIG. 4) within the selected gate circuit 21 are made conducting. At this time, the signals RA1 and RA2 go to inactive levels (namely, RA1 at the high level, and RA2 at the low level), which causes both of the transistors 55 and 56 to be turned off, interrupting the power supply for the latch circuit that forms the register. The levels of the wirings La and Lb are fetched into the latch circuit, the signals RA1 and RA2 go back again to the original active levels, and the transistors 55 and 56 go to the on-state, so that there is obtained a state where the source voltage holds the supplied data. As a result, one half of the complementary data amplified by the sense amplifier circuit 14 is transferred to the data register circuit 22. Upon transferring the data the control signal DT0 falls, and the selected gate circuit 21 goes to nonconducting state.

When the data is transferred to the data register circuit 22, the selector 23 generates a selection signal SL for selecting a predetermined register of the data register circuit 22. Since the gate transistors 57 and 58 that constitute the transfer gate (see FIG. 5) are energized by the selection signal SL, the register selected by the selector 23 supplies the stored data to the signal lines SEO (see FIG. 5).

Following that, as the signal SE falls (at t604) the serial I/O buffer 16 (FIG. 1) is activated, and the data supplied to the signal lines SEO are output from the input/output terminal SIO. In addition, by pulsing the SC signal (at t605) the value of the address counter 24 is incremented, the selector 23 selects a predetermined register out of the data register circuit 22 based on the new value of the address counter 24, and supplies the data in the register to the signal lines SEO. The serial I/O buffer 16 which has already been activated outputs the data instantly. By repeating the pulsing of the SC signal, the data in the data register circuit 22 are serially output from the serial input/output terminal SIO, and the signal SE rises upon completion of the output operation. By the operation described in the above, one half of the complementary data amplified by the sense amplifier is output (so far for FIG. 6(a)).

Next, referring to FIG. 6(b), the operation for outputting the remaining one half of the data will be described.

First, a row address is supplied to the row decoder 12 (at t606), and a tap address is sent (at t607) to the address counter 24, analogous to the case of the operation showing in FIG. 6(a). The row decoder 12 selects one word line based on the row address, and the data governed by the word line are supplied to the respective bit lines that are connected. The sense amplifier circuit 14 amplifies the data as mutually complementary data.

Then, by the rise (at t608) of the signal $\overline{OE}$ while the signal $\overline{WE}$ is at the high level, the control signal DT1 generated by the clock generator 17 is made to rise by the top element address for write to the data register circuit 22 and the tap address information that includes the selection information (information which shifts the control signal DT1 to the active level) for the selected gate circuit 21, and the gate transistors Q2a and Q2b, Q4a and Q4b, Q6a and Q6b, and the like (see FIG. 4) are made conducting. By this action, the signals RA1 and RA2 go to inactive levels (namely, RA1 is at the high level, and RA2 is at the low level), bringing both of the transistors 55 and 56 to the off-state, and interrupts the power supply for the latch circuit that forms the register. The levels of the wirings La and Lb are fetched into the latch circuit, the signals RA1 and RA2 go back again to their original active levels, and the transistors 55 and 56 go to the on-state, so that the source voltage is supplied and the system goes to a state that holds the data. As a result, the remaining one half of the complementary data that were amplified by the sense amplifier 14 are transferred to the data register circuit 22. As the data is transferred the control signal DT1 falls, and the selected gate circuit 21 goes to the nonconducting state.

When the data is transferred to the data register circuit 22, the data are output serially from the serial input/output terminal SIO analogous to the case shown in FIG. 6(a).

Next, the operation of storing the data input from the input/output terminal SIO in the data register circuit 22, and further transferring the stored data to the memory cell array will be described.

Figure 7A:
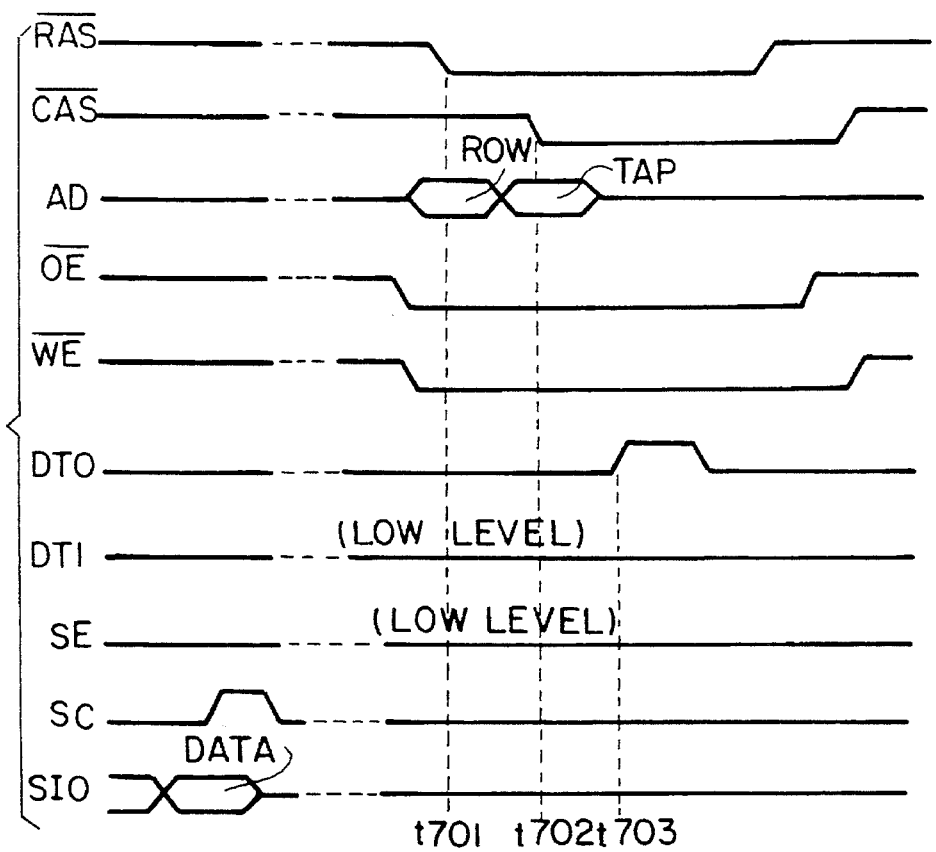
FIGS. 7(a) and 7(b) are timing charts for explaining the serial data write operation in the semiconductor memory device including the circuit shown in FIG. 4 or FIG. 5.

As shown in FIG. 7(a), when the signal SC is clocked, the selector 23 generates a selection signal SL based on the information from the address counter 24 (FIG. 1). In response to the selection signal SL, the gate transistors 57 and 58 of a predetermined register of the data register circuit 22 are energized and the data input from the serial input/output terminal SIO are supplied to the wirings La and Lb. At this time, the signals RA1 and RA2 go to the inactive levels (RA1 at the high level, and RA2 at the low level), both of the transistors 55 and 56 are brought to the off-state, and the power supply for the latch circuit that forms the register is interrupted. The levels of the wirings La and Lb are fetched in the latch circuit, the signals RA1 and RA2 go back to the original active levels, and the transistors 55 and 56 go to the on-state, and the source voltage is supplied and the device goes to the state which holds the data. A data input from the serial input/output terminal SIO is stored as described in the above. Then, the value of the address counter 24 is incremented.

By repeating the clocking of the SC signal a data is written in advance in the data register circuit 22. Then, a row address is supplied to the row decoder 12 at the time of fall (t701) of the RAS signal, and a tap address, that includes the selection information (information which shifts the control signal DT0 to the active level) for the selected gate circuit 21, is supplied to the address counter 24 at the time of the succeeding fall (t702) of the CAS signal. The row decoder 12 selects one word line based on the row address. Next, when the $\overline{\text{WE}}$ signal is at the low level and the $\overline{\text{OE}}$ signal is also at the low level, the control signal DT0 generated by the clock generator 17 is made to rise by the selection information for the selected gate circuit 21 of the tap address supplied by the address counter 24, and the gate transistors Q1a and Q1b, Q3a and Q3b, Q5a and Q5b, and the like (see FIG. 4) within the selected gate circuit 21 are made conducting. In this manner, one half of the sense amplifiers (SA1, SA3, SA5, and the like in FIG. 4) of the totality of the sense amplifiers in the sense amplifier circuit 14 are connected to the data register circuit 22. Then, by the activation of the sense amplifier circuit 14, the above-mentioned one half of the sense amplifiers amplify the data in the data register circuit 22, and the data are stored in the predetermined memory cells that are governed by the selected word lines. On the other hand, the remaining one half of the sense amplifiers amplify the data that had been stored in the memory cells previously, and execute the operation analogous to the refresh operation. With the above-mentioned operation, data stored in the data register circuit 22 are transferred to the one half of the memory cells that are governed by one word line of the memory cell array 10 (so far for FIG. 7(a)).

Figure 7B:
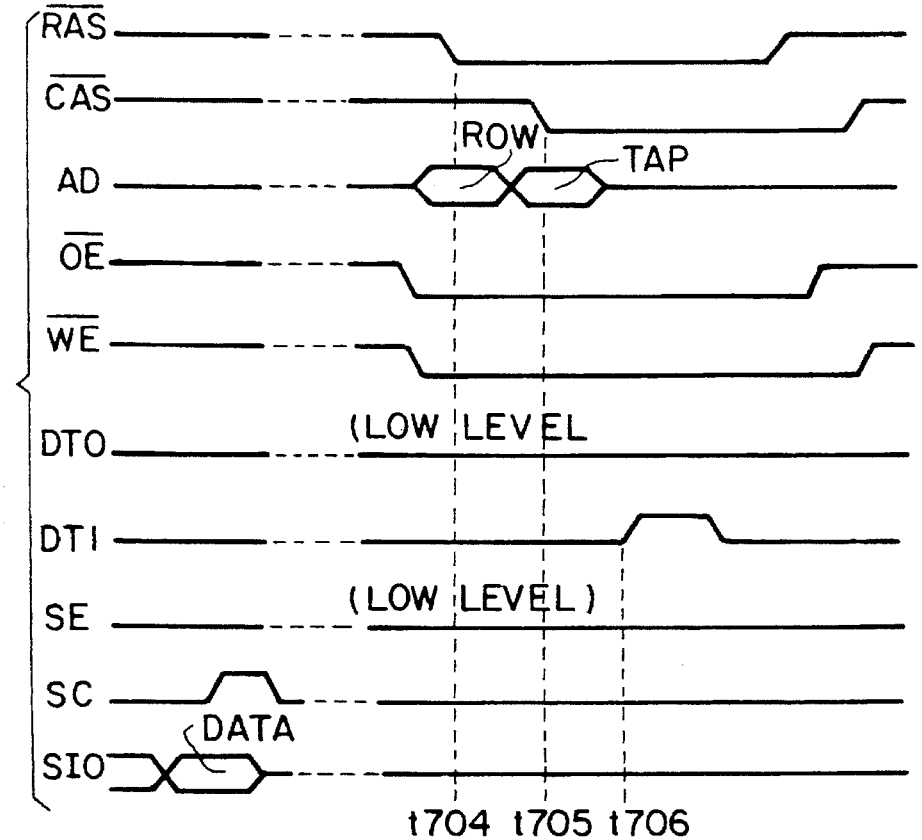

Next, referring to FIG. 7(b), the operation of transferring data to the remaining one half of the memory cells will be described.

Similar to the case of FIG. 7(a), a data is written to the data register circuit 22 by repeating the clocking of the SC signal. Then, row address is supplied to the row decoder 12 at the time of fall (t704) of the $\overline{\text{RAS}}$ signal, and a tap address that includes the selection information (information that shifts the control signal DT1 to the active level) for the selected gate circuit 21 is supplied to the address counter 24 at the succeeding fall (t705) of the $\overline{\text{CAS}}$ signal. The row decoder 12 selects one word line based on the row addresses. Next, when the $\overline{\text{WE}}$ signal is at the low level and the $\overline{\text{OE}}$ signal is also at the low level, the control signal DT1 generated by the clock generator 17 is made to rise by the selection information for the selected gate circuit 21 of the tap address supplied by the address counter 24, and the gate transistors Q2a and Q2b (see FIG. 4) within the selected gate circuit 21 are made conducting. As a result, the remaining one half of the sense amplifiers (SA2, SA4, SA6, and the like in FIG. 4) of the sense amplifiers in the sense amplifier circuit 14 are connected to the data register circuit 22. Then, by activating the sense amplifier circuit 14, the remaining one half of the sense amplifiers amplify the data in the data register circuit 22, and stores the data in the predetermined memory cell governed by the selected word line.

In the embodiments described in the above, for both of the read operation and the write operation, the selection for bringing either of the control signals DT0 and DT1 that control the energization of the selected gate circuit 21 to the active level was determined by the selection information that is included in the tap address supplied to the address counter 24 at the time of fall of the $\overline{\text{CAS}}$ signal. However, the present invention is not limited to this case alone, and an effect similar to the embodiment described above may be obtained by, for example, providing within the clock generator 17 a circuit that automatically generates a control signal in such a way as to make the control signal DT0 to be at the active level at a first read or write operation, and make DT1 to be at the active level at the time of a second operation.

Next, referring to FIG. 8, the second embodiment of the present invention will be described.

This embodiment has a construction in which the memory cell array is subdivided into two regions of 10a and 10b, and selected gate circuits 31a and 31b, data register circuit 32, selector 23 and the like are arranged between the two regions. The selected gate circuits 31a and 31b are constructed by the gate transistors Q11a, Q11b, Q12a, Q12b, Q13a, Q13b, Q14a and Q14b, and Q21a, Q21b, Q22a, Q22b, Q23a, Q23b, Q24a and Q24b whose continuity is controlled by the control signals DT10, DT11, DT12 and DT13, and DT14, DT15, DT16 and DT17, respectively.

The data register circuit 32 is constructed by arranging a plurality of registers 32-1, 32-2, 32-3, and the like in a line, analogous to the data register circuit 22 shown in FIG. 4. A concrete circuit example of the register may have the same construction as the register shown in FIG. 5, and the data read and write operations may be carried out in response to the selection signals SL from the selector 23.

In the present embodiment, for one register (for example, 32-1) there are connected four sense amplifiers (for example, SA11, SA12, SA21 and SA22) via gate transistors. The control signals (DT10, DT11, DT16 and DT17 for the register 32-1) control the continuity of these gate transistors, and either sense amplifier is connected electrically to one register.

The random access operation of the memory cell arrays 10a and 10b, the data transfer operation between the memory cell arrays 10a, 10b and the data register circuit 32 and the serial data input/output operation of the data register circuit 32 are basically the same as in the first embodiment described above except for the difference in the conduction time of the gate transistor of the selected gate circuit 31.

With the construction as in the above, it is possible to share one register for twice as many (namely, four) sense amplifiers as in the first embodiment, so that the area of the formation region of the data register 32 can be reduced to one half of that of the first embodiment. Moreover, the types of the control signals for the selected gate circuit is increased so that the degree of freedom for the data register selection is increased, thereby obtaining an effect of being able to carry out a more flexible data transfer control. Furthermore, by the division of the memory cell array into two parts, the lengths of the wirings within the memory cell array is reduced to one half, and the wiring capacitance can be reduced and the charging/discharging current can be reduced.

In the embodiments described in the above, the memory cell arrays 10, 10a and 10b are assumed to be DRAMs, but the present invention is not limited to that case alone, and can also be applied to the case of static random access memory (SRAM).

Now, the registers 22-1, 22-2, 22-3, and the like that constitute the data register circuit 22 in the first and the second embodiments have been described using the well-known circuit construction shown in FIG. 5 as an example. However, when a data register is constructed by using the registers with that circuit construction, there arises the following problem. Namely, as shown in FIG. 5, the register stores the data including the wiring capacitance of the wirings La and Lb. Since the lengths of the wirings La and Lb are large, the wiring capacitance is accordingly large. Because of this, when the level of the data to be stored in the register is rewritten from the high level to the low level or vice versa, the charging/discharging current becomes large, generating a problem that a high speed operation is difficult to achieve. Moreover, when the wiring capacitance is increased, the level of the write data supplied from the memory cell array part is changed, creating a possibility of the malfunction of the device.

In order to resolve these problems the present inventors devised a register which has a small charging/discharging current at the time of data writing. In what follows we will describe the third embodiment of the present invention which is realized by applying such registers to the semiconductor memory device in the second embodiment of the present.

Figure 8:
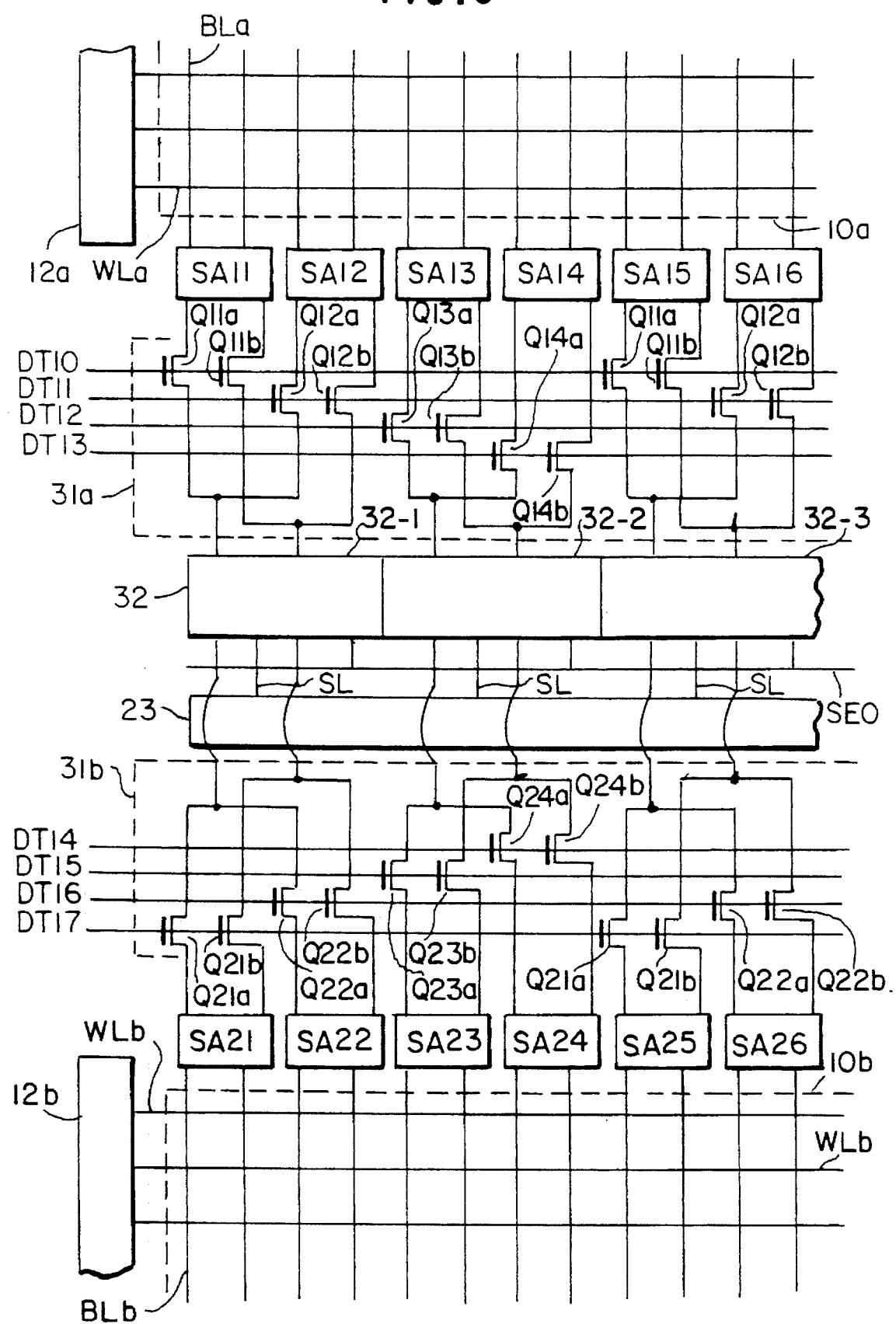
FIG. 8 is a circuit diagram showing the partial circuit construction of a second embodiment of the present invention.
Figure 9:
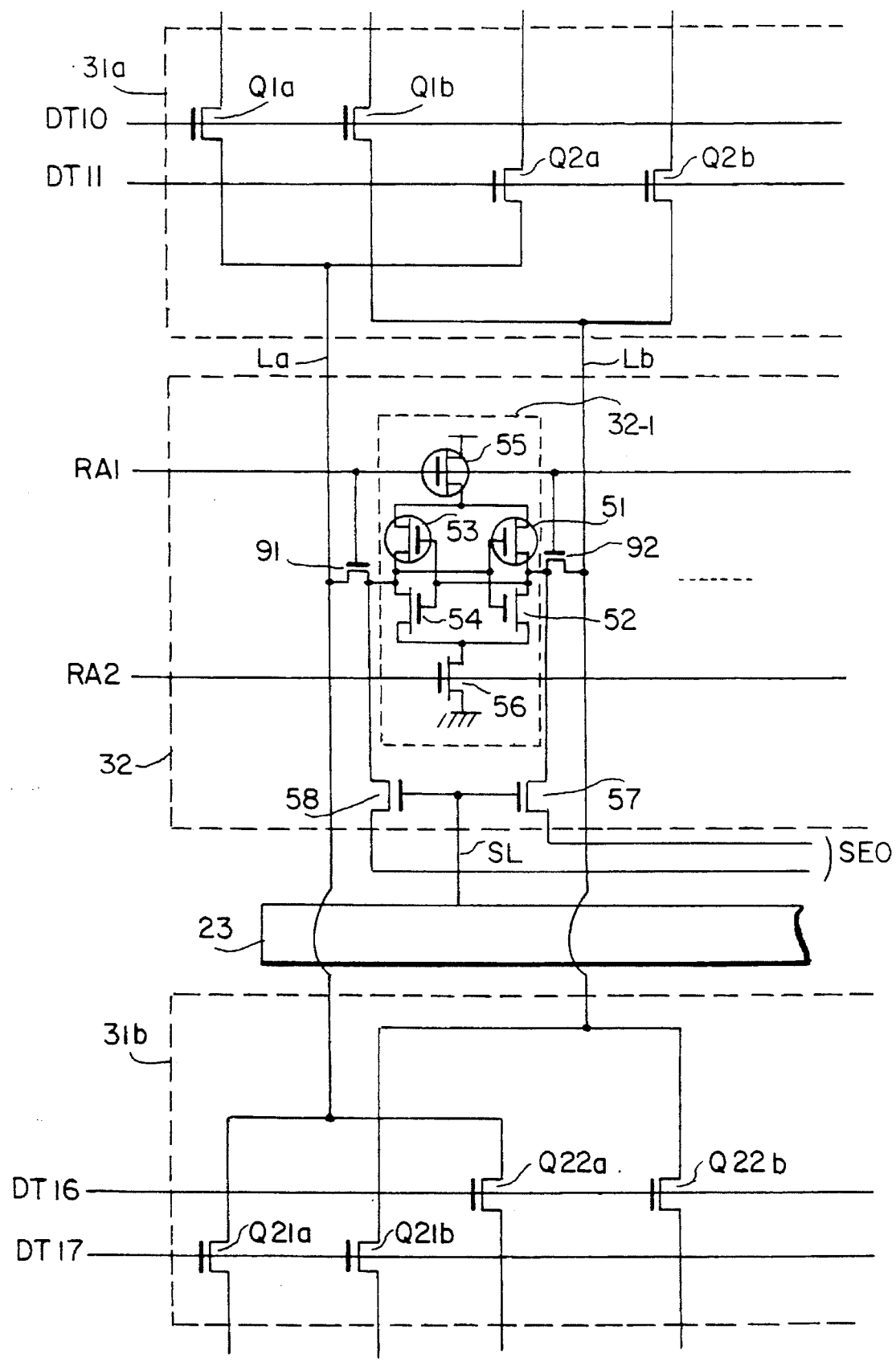
FIG. 9 is a circuit diagram showing the partial circuit construction of a third embodiment of the present invention.

FIG. 9 shows an example of applying the registers with new circuit construction to the registers (32-1, 32-2, 32-3, and the like) that constitute the data register circuit 32 of the semiconductor memory device shown in FIG. 8. This register 32-1 comprises mutually complementary wirings La and Lb that are connected to either of the output line pairs of the sense amplifiers SA11, SA12, SA21 and SA22 (FIG. 8) that are selected by the selection gates 31a and 31b, a CMOS inverter consisting of a P-channel transistor 51 and an N-channel transistor 52 which have the wiring La as their inputs via an N-channel gate transistor 91, and a CMOS inverter consisting of a P-channel transistor 53 and an N-channel transistor 54 which have the wiring Lb as their inputs via an N-channel gate transistor 92, and includes a latch circuit constituted by respectively connecting the output of one inverter to the input of the other inverter, and a P-channel transistor 55 and an N-channel transistor 56 which supply powers to the latch circuit, with their continuity being controlled by the signals RA1 and RA2 that are in mutually complementary relation. The signal RA1 is also supplied to the gates of the gate transistors 91 and 92, and controls the continuity of these gate transistors.

In such a register 32-1, the gate registers 91 and 92 are in the off-state while the signals RA1 and RA2 are at active levels (RA1 at the low level, and RA2 at the high level) so that the device is complementarily storing the data 0 or 1 in a state which is independent of the wirings La and Lb, and moreover, both of the P-channel 55 and the N-channel transistor 56 are in the on-state. Therefore, the device is capable of holding the high level data by supplementing the necessary electric charge from the power supply through one transistor which is in the on-state out of the two P-channel transistors 51 and 53, and holding the low level data by allowing the excess electric charge to flow to the grounding through one transistor which is in the off-state out of the two N-channel transistors 52 and 54. When in the aforementioned state the selection signal SL from the selector 23 goes to the active level, the gate transistors 57 and 58 that constitute the transfer gates are energized, and the stored data are supplied to the pair of signal lines SEO via the serial I/O buffer. Further, when the gate transistors 91 and 92 are in the off-state, either of the gate transistors of the selected gate circuits 31a and 31b goes to the on-state, and the potential of the wirings La and Lb goes to the potential of the bit lines BLa and BLb (see FIG. 8) of the memory cell array 10 when they are not in the write or read state, namely, the pre-charged potential ½ Vcc.

Next, the random access operation of the memory cell array 10, the data transfer operation between the memory cell arrays 10a and 10b, and the data register circuit 32, and the serial data input/output operation of the data register circuit 32 will be described. The difference in the operation between the present embodiment, and the first and second embodiments resides in the difference in the energization times of the selected gates. Namely, since the gate transistors 91 and 92 are in the off-state except for the time of read or write operation for the data register circuit 32, the wirings La and Lb have to be connected to wirings with some levels or the like in order to avoid the state where they are connected nowhere, in other words, in order to avoid the state in which their level are indefinite. For that reason, the selected gate circuit 31 will be found in the energized state except for the time of the read or write operation for the data register circuit 32, and the level of the wirings La and Lb is given the value of ½ Vcc. For other operations, their timings are the same as in the first embodiment described above so that they are going to be described only briefly.

Figure 10:
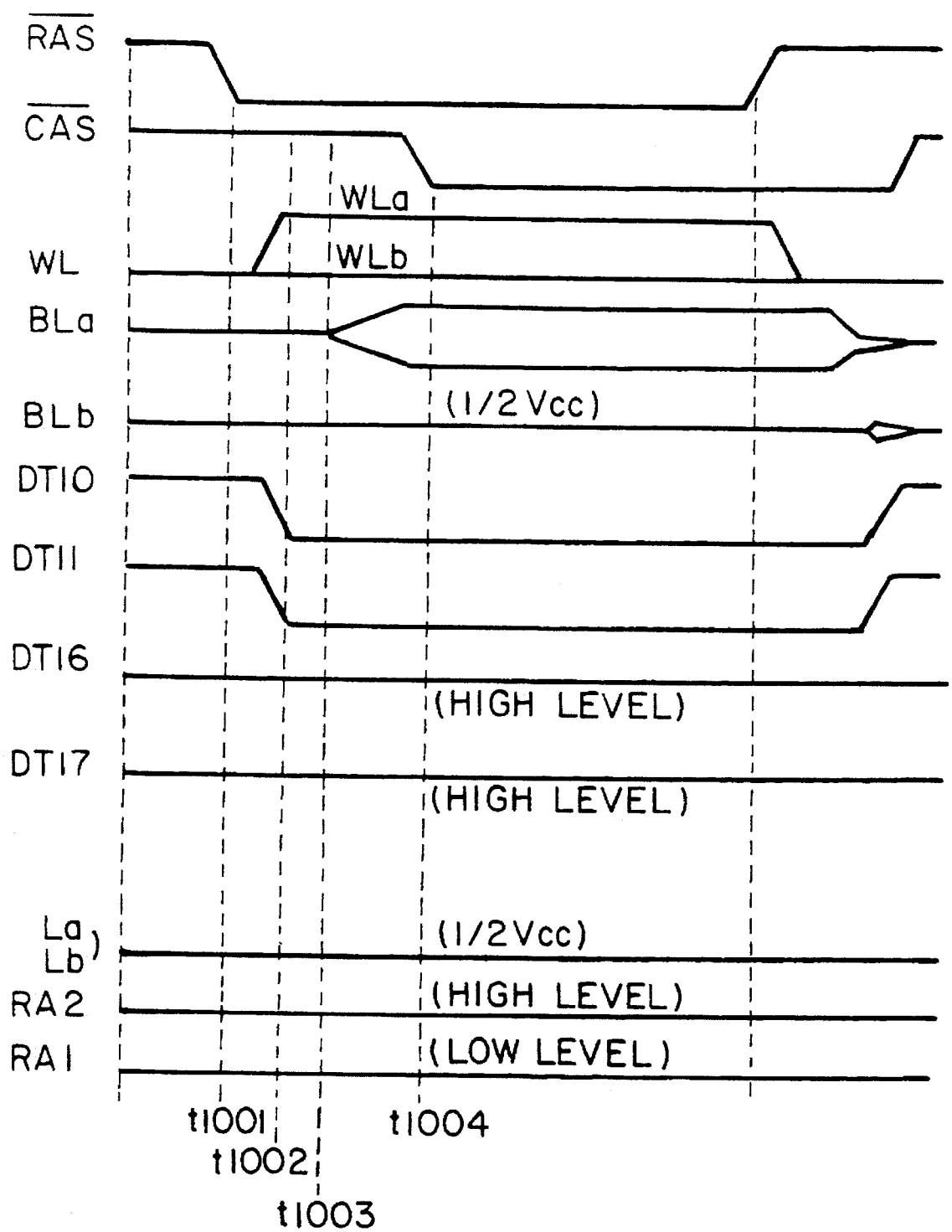
FIG. 10 is a timing chart for explaining the random access operation of the semiconductor memory device shown in FIG. 9.

FIG. 10 is a timing chart showing the random access operation of the present embodiment. When a row active $\overline{RAS}$ signal is input (at t1001), a row address is given to the row decoders 12a and 12b, and one word line selected by the row address signal (the word line WLa of the memory cell array 10a in this case) goes to the high level. Next, prior to activation of the sense amplifiers, the selection signals DT10 and DT11 are assigned to the low level (at t1002) in order to bring the selected gate circuit 31a on the side of the selected memory cell 10a to a nonconducting state. Then, the sense amplifiers on the side of the memory cell array 10a are activated, and the high level or the low level of the bit lines within the memory cell array 10a on the side of the selected word line is sensed and amplified (at t1003). At this time, the memory cell array 10b is not selected and the sense amplifiers are not activated, and the potential of the all bit lines is that of precharging, namely, ½ Vcc. Then, in order to avoid an indefinite state for the level of the wirings La and Lb, the selected gate circuit 31b on the side of the memory cell array 10b is brought to the conducting state, and the level of the wirings La and Lb is made to be ½ Vcc while maintaining the high level of the control signals DT16 and DT17.

Next, a low active $\overline{CAS}$ signal is input (at t1004), and a column address is sent to the column decoder. Next, the column decoder selects a bit line pair in response to the column address.

Here, if the device is in read operation, information in the selected cell corresponds to the high or low level state of the selected bit line pair so that the level of the bit line pair is output from the input/output terminal RIO for random access.

On the other hand, if the device is in write operation, the input write data is supplied to the selected bit line pair, and the sense amplifier amplifies the input data and writes it to the memory cell. In either case, the signals RA1 and RA2 hold the aforementioned active level, hold the data of the data register circuit 32, and are isolated from the wirings La and Lb.

It should be noted that this semiconductor memory device is a dual port memory so that the device is capable of executing the serial input/output operation of the data register circuit simultaneous with the random access operation. In that case, either of the gate selection circuits 31a and 31b goes to the conducting state so that the operation of the circuits 31a and 31b prevents the wirings La and Lb from going to an indefinite state, similar to the case mentioned above.

Figure 11:
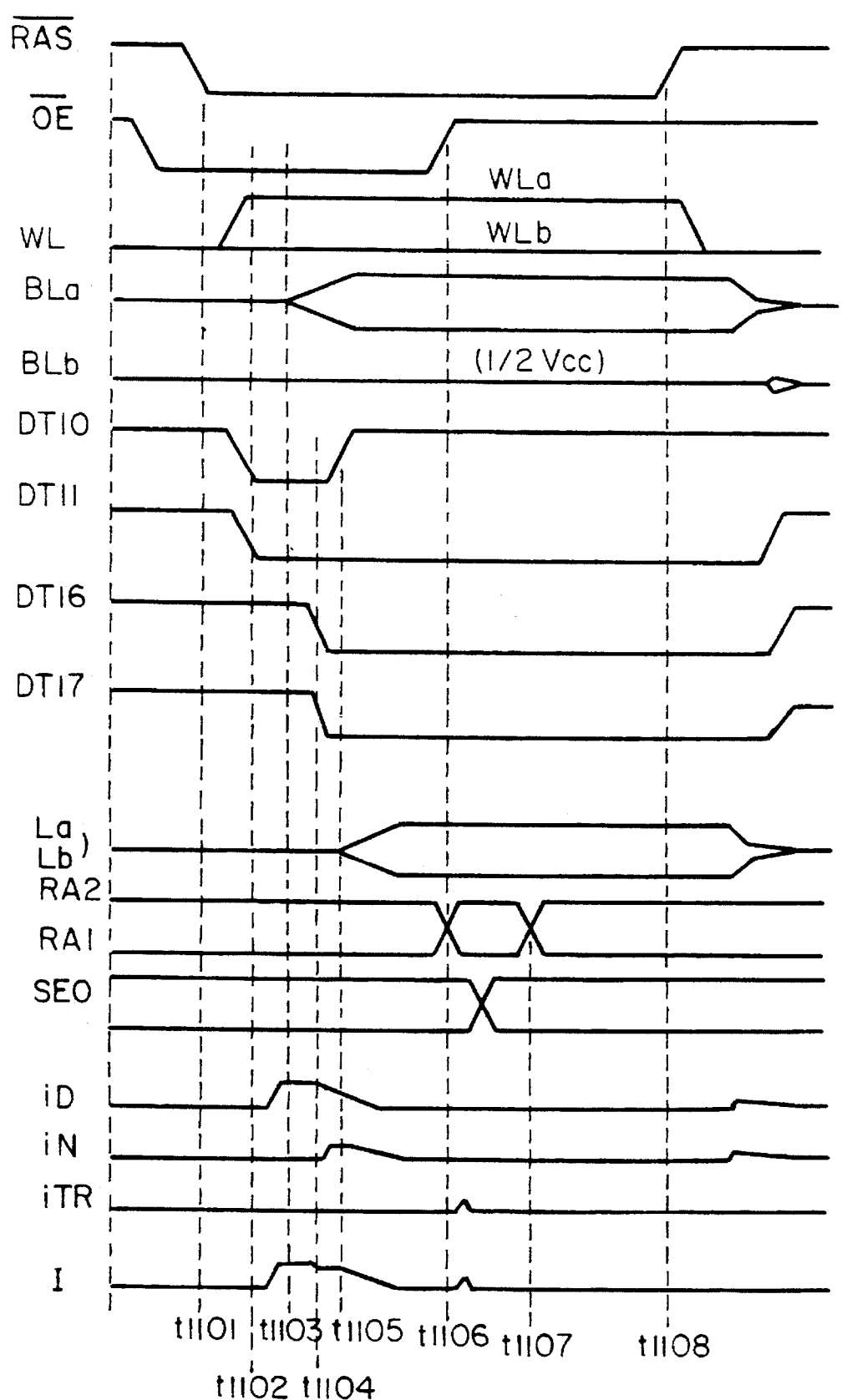
FIG. 11 is a timing chart for explaining the data transfer operation of the semiconductor memory device shown in FIG. 9.

Next, referring to FIG. 11, the data transfer operation from the memory cell array 10 to the data register circuit 32 will be described. When a low active $\overline{RAS}$ signal is input (at t1101) after the fall of the $\overline{OE}$ signal, a row address is given to the row decoders 12a and 12b, and one word line selected by the row address signal (the word line WLa of the memory cell array 10 in the present case) goes to the high level. Next, a low active $\overline{CAS}$ signal is input, and a tap address including information about the control signal is sent. Then, prior to the activation of the sense amplifier, the selection signals DT10 and DT11 are brought to the low level (at t1102) in order to make the selected gate circuit 31a on the side of the selected memory cell 10a to be in the nonconducting state. Following that, the sense amplifiers on the side of the memory cell array 10a are activated, and the high level or the low level of the bit lines within the memory cell array 10a on the side of the selected word line is sensed and amplified (at t1103). At this time, the charging/discharging of the wiring capacitor of the bit lines in the memory cell array is carried out, and a current iD is consumed. It is to be noted that up to this time the control signals DT16 and DT17 are maintaining the high level, and the selected gate circuit 31b is in the conducting state, keeping the level of the wiring La and Lb at ½ Vcc.

Next, the control signals DT16 and DT17 go to the low level (at t1104), and the selected gate circuit 31b goes to the nonconducting state. Immediately following that, the control signal DT10 alone goes to the high level (at t1105), Q1a and Q1b among the gate transistors of the selected gate circuit 31a go to the conducting state, and one register (32-1 in this case) and one sense amplifier (SA11 (see FIG. 8) in this case) are connected. At this time, the data of the memory cell array 10a is transferred to the wiring La or Lb whose potential was ½ Vcc, and the level of the wiring goes to 0 or 1 (Vcc) so that current iN is consumed.

Next, by causing the $\overline{OE}$ signal to rise, a data transfer is indicated and the data register control signals RA1 and RA2 are made inactive (RA1 at the high level, and RA2 at the low level), and the power supply for the latch circuit which forms the register is interrupted by bringing both of the transistors 55 and 56 to the off-state. At this time, the gate transistors 91 and 92 are brought to the on-state by the high level control signal RA1 so that the levels of the wirings La and Lb are fetched in the latch circuit. In this operation, the data transfer to the latch circuit (at t1106) can be accomplished at low power consumption because of the small value of the wiring capacitance.

After the data transfer to the register, the data register control signals RA1 and RA2 go back again to the original active levels (at t1107) and the gate transistors 91 and 92 go to the off-state so that the register 32-1 is isolated from the wirings La and Lb, and the transistors 55 and 56 go to the on-state so that the source voltage is supplied and the device goes to a state which can hold the data.

Finally, with the rise of the RAS signal the word line WLa of the memory cell array goes to the low level, then the potentials of all of the bit line pairs becomes ½ Vcc. Next, the selected gate circuits 31a and 31b are brought to the conducting state by causing all of the control signals DT11, DT16 and DT17 to be the high level, and the potential of the wirings La and Lb are made to be ½ Vcc.

With the above-mentioned operation, the data transfer operation from the memory cell array 10 to the data register circuit 32 is completed.

As to the operation of serial data output from the data register circuit 32 in the present embodiment, it is similar to what is done after the time t604 or t609 in FIGS. 6(a) and 6(b) so that it will not be reproduced here.

Moreover, for the data transfer operation from the data register circuit 32 to the memory cell array 10 one only needs to activate the sense amplifiers and let the memory cells store the data, after making the wirings La and Lb to be the levels of the stored data in the registers by energizing the gate transistors 91 and 92 through energization of either of the gate transistors (Q1a, Q1b, and the like) of the selected gate circuit 31 without activation of the sense amplifiers of the memory cell array.

Figure 12:
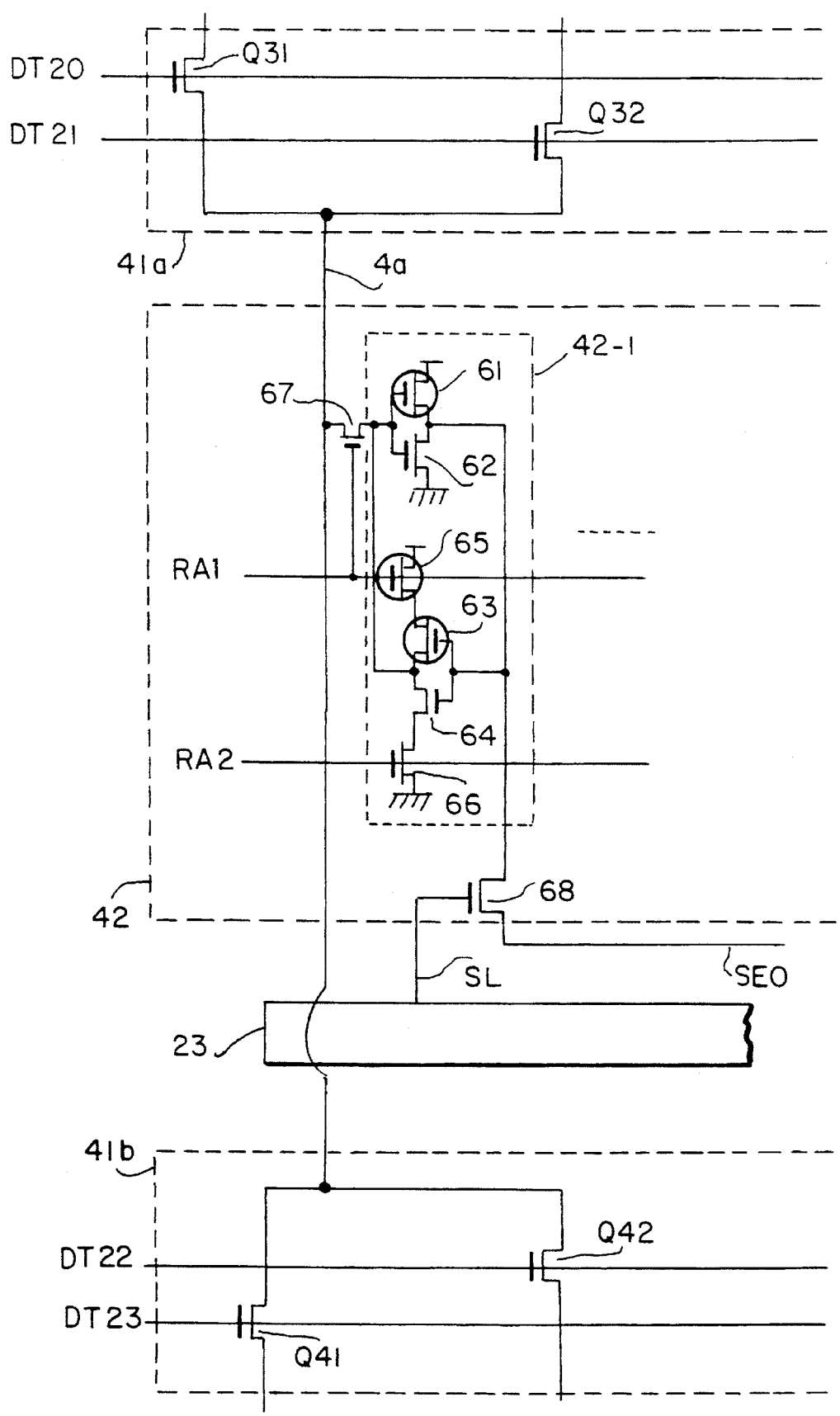
FIG. 12 is a circuit diagram showing a partial circuit construction of a fourth embodiment of the present invention.

Next, referring to FIG. 12, the fourth embodiment of the present invention will be described. The present embodiment differs from the third embodiment shown in FIG. 9 in that the data transfer between the memory cell array and the data register circuit is given an input/output construction instead of a complementary data construction. The register 42-1 includes a wiring La which is connected to the output line of either of the sense amplifiers (not shown) selected by the selection gates 41a and 41b, a latch circuit constituted of a CMOS inverter consisting of a P-channel transistor 61 and an N-channel transistor 62 which has the wiring La as the input via a gate transistor 67, and a CMOS inverter consisting of a P-channel transistor 63 and an N-channel transistor 64 which has the output of the above-mentioned CMOS inverter as the input, and the gate transistors 65 and 66 which supplies powers to the latch circuit, and whose energization is controlled by the complementary signals RA1 and RA2, respectively. The signal RA1 is supplied also to the gate of the gate transistor 67, and controls the energization of the transistors 65, 66 and 67.

The operation of the present embodiment is basically the same as the operation of the circuit shown in FIG. 9 except that the input and the output data are put into one.

As in the above, the present invention is applicable not only to a semiconductor memory device that handles complementary data, but also to a semiconductor memory device that handles a single data.

The register that is used in the third and the fourth embodiments is not only applicable to the circuit construction used in the first and the second embodiments, namely, the circuit construction in which the register circuit is connected by selecting one out of a plurality of sense amplifiers by means of a selected gate circuit, but also to the circuit construction in which there is provided one register for one sense amplifier.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

I claim:

1. A semiconductor memory device comprising:

a memory cell array including a first and a second word line, a first, second and a third pair of bit lines, a first and a second memory cell each associated with said first word line and said first and second pairs of bit lines respectively, and a third memory cell associated with said second word line and said third pair of bit lines, said first and second memory cells being connected and outputting a data therein to said first and second pair of bit lines according to a first logical level of said first word line while said third pair of bit lines maintains precharge level thereof independent of data in said third memory cell;

a data bus line associated with said first, second and third pairs of bit lines;

a control circuit for outputting a selection signal;

a gate circuit for disconnecting said first and second pair of bit lines from said data bus line and connecting said third pair of bit lines maintaining said precharge level thereof to said data bus line according to a first logical state of said selection signal, thereby supplying said precharge level to said data bus line, and selectively connecting one of said first and second pair of bit lines each provided with said data of said first and second memory cell to said data bus line and disconnecting said second pair of bit lines from said data line according to a second logical state of said selection signal, thereby supplying said data of one of said first and second memory cells to said data line;

means for supplying a latch control signal which changes from a first logical level to a second logical level after said data bus line is provided with said data; and a latch circuit associated with said data bus line for storing said data of said first memory cell appearing on said data line according to said second logical level of said latch control signal.

2. A semiconductor memory device comprising:

a memory cell array including a plurality of word lines, a plurality of pairs of bit lines, and a plurality of memory cells, each memory cell being associated with a respective one of said word lines and a respective one of said pairs of bit lines, said pairs of bit lines being arranged into a plurality of groups, each group having a first and a second pair of bit lines;

a plurality of pairs of data bus lines provided in one to one correspondence with said groups;

a first means for generating selection information;

a gate circuit responding to said selection information and coupling said first pair of bit lines in each of said groups to an associated pair of said pairs of data bus lines when said selection information takes a first state and coupling said second pair of bit lines in each of said groups to an associated one of said pairs of data bus lines when said information takes a second state;

a second means for generating a latch control signal; and a plurality of latch circuits provided in one to one correspondence with said pairs of data bus lines and supplied in common with said latch control signal, each of said latch circuits including first and second nodes, a first transfer gate connected between said first node and one of an associated pair of said pairs of data bus lines, a second transfer gate connected between said second node and the other of said associated one of said pairs of data bus lines, and a data latch portion connected between said first and second nodes and, when activated, amplifying a potential difference between said first and second nodes and holding an amplified potential difference, each of said first and second transfer gates assuming an open state to connect each of said first and second nodes to each of said associated pair of said pairs of data bus lines and said data latch portion being deactivated when said latch control signal takes a first logic level and each of said first and second transfer gates assuming a closed state to disconnect each of said first and second nodes from each of said associated pair of said pairs of data bus lines and said data latch portion being activated when said latch control signal takes a second logic level, said second means setting said latch control signal at said first logic level while said gate circuit is coupling one of said first and second pairs of bit lines in each of said groups to an associated pair of said pairs of data bus lines and thereafter changing said latch control signal to said second logic level, wherein said data latch portion includes a flip-flop circuit having a first and second input/output ends connected respectively to said first and second nodes and a switching transistor coupled between said flip-flop circuit and a power supply line, said switching transistor being coupled to said second means to receive said latch control signal and rendered nonconductive when said latch control signal takes said first logic level to disconnect said flip-flop circuit from said power supply line and conductive when said latch control signal takes said second logic level to connect said flip-flop circuit to said power supply line.

3. The device as claimed in claim 2, wherein said switching transistor comprises a first MOS transistor of a first channel type connected between said flip-flop circuit and said power supply line, said first transfer gate comprises a second MOS transistor of a second channel type connected between said first node and said one of said associated pair of said pairs of data bus lines, and said second transfer gate comprises a third MOS transistor of said second channel type connected between said second node and said other of said associated pair of said pairs of said data bus lines, said latch control signal being supplied in common to gates of said first, second and third MOS transistors.

4. A semiconductor memory device comprising:

first and second memory cell array blocks, each of said first and second memory cell array blocks including a plurality of word lines, a plurality of bit lines and a plurality of memory cells, each memory cell being coupled to a respective one of said word lines and a respective one of said bit lines, said bit lines being arranged into a plurality of groups, each group including first and second bit lines, one of said first and second memory cell array blocks being in a selecting state while the other of said first and second memory cell array blocks is in a precharging state to produce a precharging level at each of said bit lines, a plurality of data bus lines provided in one-to-one correspondence with said groups;

a plurality of data latch circuit provided correspondingly to said data bus lines;

a first gate circuit coupling said first bit line in each of said groups in said first memory cell array block to an associated one of said data bus lines when a first control signal supplied thereto takes an active level;

a second gate circuit coupling said second bit line in each of said groups in said first memory cell array block to an associated one of said data bus lines when a second control signal supplied thereto takes an active level;

a third gate circuit coupling said first bit line in each of said groups in said second memory cell array block to an associated one of said data bus lines when a third control signal supplied thereto takes an active level;

a fourth gate circuit coupling said second bit line in each of said groups in said second memory cell array block to an associated one of said data bus lines when a fourth control signal supplied thereto takes an active level; and means for generating and controlling said first to fourth control signals such that after each of said data bus lines is precharged to said precharging level at each of said bit lines of said other of said first and second memory cell array blocks, said one of said first and second memory cell array blocks is coupled to each of said data bus lines to transfer data from said one of said first and second memory cell array blocks to said data latch circuits while disconnecting said other of said first and second memory cell array blocks from said data bus lines.

* * * * *

UNITED STATES PATENT AND TRADEMARK OFFICE
CERTIFICATE OF CORRECTION

PATENT NO. : 5,463,584
DATED : October 31, 1995
INVENTOR(S) : Yasuharu HOSHINO

It is certified that error appears in the above-indentified patent and that said Letters Patent is hereby corrected as shown below:

Col. 4, line 53, after "22-1,", insert --22-2,--.

Signed and Sealed this

Eleventh Day of June, 1996

Attest:

BRUCE LEHMAN

*Attesting Officer*  *Commissioner of Patents and Trademarks*